(12) United States Patent
Chuah et al.

(10) Patent No.: US 10,939,540 B2
(45) Date of Patent: Mar. 2, 2021

(54) SHIELDED FOLDED CIRCUIT BOARD

(71) Applicant: Intel Corporation, Santa Clara, CA (US)

(72) Inventors: Tin Poay Chuah, Penang (MY); Yew San Lim, Penang (MY); Boon Ping Koh, Penang (MY); Phaik Kiau Tan, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/399,825

(22) Filed: Apr. 30, 2019

(65) Prior Publication Data
US 2019/0261504 A1   Aug. 22, 2019

(51) Int. Cl.
| H05K 1/11 | (2006.01) |
| H05K 1/02 | (2006.01) |
| H05K 3/36 | (2006.01) |
| H05K 1/14 | (2006.01) |

(52) U.S. Cl.
CPC .............. *H05K 1/0216* (2013.01); *H05K 1/14* (2013.01); *H05K 3/368* (2013.01); *H05K 2201/058* (2013.01)

(58) Field of Classification Search
USPC ......................................................... 361/803
See application file for complete search history.

(56) References Cited

U.S. PATENT DOCUMENTS

| 6,582,246 B1* | 6/2003 | Rensi ................. H01R 13/5213 439/377 |
| 2015/0261265 A1* | 9/2015 | Dean .................... G01R 1/0408 361/679.31 |
| 2015/0270227 A1* | 9/2015 | Dinh ................. H01L 23/49838 361/750 |

* cited by examiner

*Primary Examiner* — Andargie M Aychillhum
(74) *Attorney, Agent, or Firm* — Schwabe, Williamson & Wyatt, P.C.

(57) ABSTRACT

A folded circuit board includes a first circuit board and a second circuit board. The first circuit board and second circuit board are coupled together through a flexible interconnect. One or more folding guides are coupled to one of the first circuit board or second circuit board. The one or more folding guides extend beyond a first edge of the one of the first circuit board or second circuit board. The one or more folding guides include a curved sidewall configured to guide the flexible interconnect when the first circuit board is folded over the second circuit board. In one embodiment, the one or more folding guides are grounded to reduce EMI emissions.

24 Claims, 10 Drawing Sheets

SHIELDED FOLDED CIRCUIT BOARD

BACKGROUND

The present disclosure relates to electronic systems, and in particular, to a folded circuit board with electromagnetic shielding.

Modern electronic systems typically comprise integrated circuits attached to multiple circuit boards for providing a wide range of electrical functions. The circuit boards provide a physical substrate for each integrated circuit and typically include electrical interconnects between the integrated circuits as well as connections to external systems. As electronic systems have become more prevalent, it has become desirable to pack more and more electrical functionality into smaller and smaller spaces. However, packing circuit boards into smaller spaces raises several significant technical challenges. For example, as circuit boards are moved closer together, electrical emissions from one circuit board performing one set of functions may impact the operation of another circuit board performing other operations. The following disclosure addresses these and other issues with improved circuit board design techniques.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, makes apparent to those of skill in the art how embodiments in accordance with the present disclosure may be practiced. Similar or same reference numbers may be used to identify or otherwise refer to similar or same elements in the various drawings and supporting descriptions. In the accompanying drawings.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Features and advantages of the present disclosure include an improved folding circuit board. A folded circuit board includes several circuit boards that may be electrically interconnected through a flexible interconnect that physically couples the circuit boards together and also provides electrical interconnection (e.g., wires) between the circuit boards. This approach may reduce the space occupied by the circuit boards in an electrical system, for example, and may further reduce number of plug-in connectors and soldering required to electrically interconnect the rigid circuit boards. A folded circuit board may include a first circuit board and second circuit board with the flexible interconnection between the first and second circuit boards. In manufacturing the folded circuit board, one of the first and second circuit boards is folded over the other and the two circuit boards then physically coupled together. The flexible interconnect is a flexible structure that may bend as the one circuit board is folded over the other while continuing to provide electrical interconnection between the boards.

Each of the first and second circuit boards may include electrical components attached to each circuit board for providing the required functionality of the particular circuit board. In operation, these electrical components may generate electromagnetic radiation or interference (EMI) that can propagate or radiate from the circuit board to adjacent electrical components of an electrical system. This electromagnetic radiation can interfere with the proper operation of these adjacent electrical components or interfere with the operation of electrical components that are not part of the electrical system but are adjacent the electrical system. Features and advantages of the present disclosure described below may include improved electromagnetic shielding on a folded circuit board to reduce EMI emissions from the folded circuit board, for example.

Figure 1:
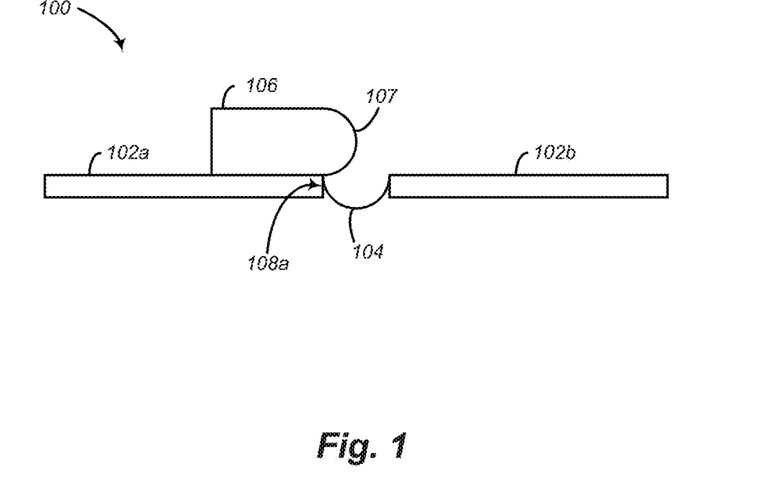
FIG. 1 is a simplified unfolded cross-sectional view of a folded circuit board according to one embodiment of the present disclosure.

FIG. 1 is a simplified unfolded cross-sectional view of a folded circuit board 100 according to one embodiment of the present disclosure. The folded circuit board 100 includes a first circuit board 102a and a second circuit board 102b coupled together through a flexible interconnect 104. The cross-sectional view of FIG. 1 shows the folded circuit board 100 when the board is unfolded, namely prior to the second circuit board 102b being folded over the first circuit board 102a. The folded circuit board 100 further includes one or more folding guides 106 coupled to the first circuit board 102a. These folding guides 106 may optionally be coupled to either the first circuit board 102a or second circuit board 102b. The one or more folding guides 106 extend beyond a first edge 108a of the first circuit board 102a and include a curved edge or surface 107 configured to guide the flexible interconnect 104 when the first circuit board 102a is folded over the second circuit board 102b, as will be explained in more detail below. The curved surface 107 may be an arced sidewall as shown in this example in some embodiments.

Figure 2:
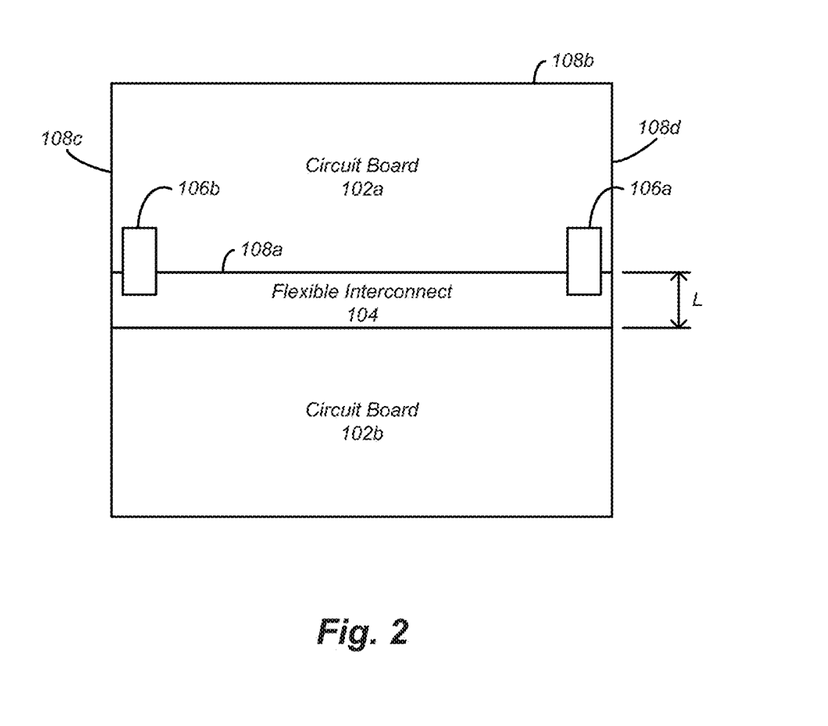
FIG. 2 is a simplified unfolded top view of the folded circuit board of FIG. 1.

FIG. 2 is a simplified unfolded top view of the folded circuit board 100 of FIG. 1. In the example embodiment of FIG. 2, the one or more folding guides 106 include two folding guides 106a, 106b that extend beyond the first edge 108a of the first circuit board 102a. Each of the folding guides 106a, 106b thus also extends over the flexible interconnect 104, as is better seen in FIG. 1. The flexible interconnect 104 has a length L as shown in FIG. 2 where this length is approximately equal to a curved length of the curved surface 107. The circuit board 102a includes a second edge 108b opposite the first edge 108a and additional edges 108c and 108d, which are also positioned opposite to each other, for example. In this example, the folding guides 106a and 106b are positioned proximate to edges 108c and 108d of the first circuit board 102a. In some embodiments, the folding guides 106a, 106b may be formed from a conductive material to provide electromagnetic shielding, for example. Positioning the guides 106a, 106b proximate to edges 108c, 108d provides improved shielding of electromagnetic radiation generated by electrical components (not shown) on the first and second circuit boards 102a and 102b, as will be described in more detail below.

Figure 3:
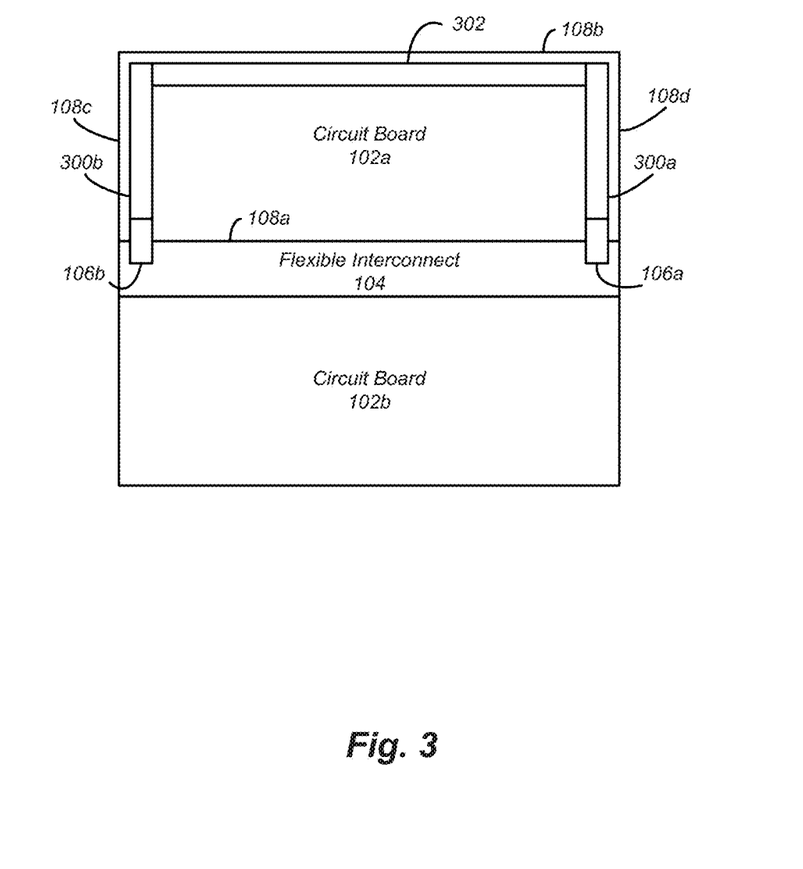
FIG. 3 is a simplified top view of a first circuit board of the folded circuit board of FIG. 1 further including a shielding and attachment structure according to an embodiment of the present disclosure.

FIG. 3 is a simplified top view of the first circuit board 102a of the folded circuit board 100 of FIG. 1 further including a sidewall shielding and attachment structure 300 according to an embodiment of the present disclosure. In this embodiment, the first and second folding guides 106a, 106b are coupled to or are formed as integral parts of first and second sidewalls 300a, 300b, respectively, proximate to edges 108c, 108d of the first circuit board 102a. More specifically, the first sidewall 300a extends from the first edge 108a towards the second edge 108b of the first circuit board 102a, with the folding guide 106a being coupled to or formed as part of the end of the first sidewall at the edge 108a. The second sidewall 300b extends from the first edge 108a towards the second edge 108b of the first circuit board 102a, with the folding guide 106b being coupled to or formed as part of the end of the second sidewall at the edge 108a. While the sidewalls are illustrated here as being on the same circuit board as the guides, in other embodiments the guides and sidewalls may be on different boards, for example.

The shielding and attachment structure 300 may also include a third sidewall 302 coupled to the first circuit board 102a proximate the second edge 108b and extending between the first sidewall 300a and the second sidewall 300b. The folding guides 106a, 106b and the sidewalls 300a, 300b and 302 may provide electromagnetic shielding of electromagnetic radiation generated by electronic components on the first and second circuit board 102a, 102b to reduce electromagnetic leakage of the folding circuit board 100, as will be described in more detail below.

In the shielding and attachment structure 300, the sidewalls 300a, 300b and 302 are configured around the edges 108b, 108c, 108d of the first circuit board 102a, and are described as being proximate to these edges in the present description. This does not mean the sidewalls 300a, 300b, 302 are any precise distance or within any specific distance from the edges 108, but instead means the sidewalls are positioned close enough to the edges to contain the desired electronic components on the first and second circuit boards 102a, 102b within the sidewalls when the folded circuit board 100 is assembled. The electromagnetic radiation generated by electronic components within the sidewalls 300a, 300b, 302 may be shielded by the sidewalls. Thus, the sidewalls 300a, 300b, 302 may be arranged near enough to the edges 108 of the circuit board 102a to thereby contain most, or all, of the electronic components of the circuit board 102a. As mentioned above for the folding guides 106a, 106b, the sidewalls 300a, 300b, 302 would typically be formed from a conductive material to provide the desired shielding. In the shielding and attachment structure 300 the sidewalls 300a, 300b, 302 also function in providing an attachment function when assembling the folded circuit board 100, as will be explained in more detail below with reference to FIGS. 4-8.

Figure 4:
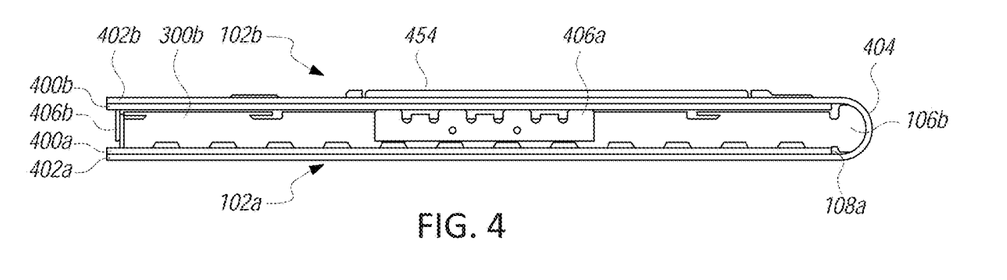
FIG. 4 is a folded side view of an example folded circuit board according to an embodiment of the present disclosure.

FIG. 4 is a folded side view of an example folded circuit board 400 according to an embodiment of the present disclosure. FIGS. 1-3 showed a folded circuit board 100, or portions thereof, when unfolded or prior to assembly. In contrast, FIG. 4 shows a side view of a folded or assembled folded circuit board. The various embodiments of folded circuit boards illustrated in FIGS. 1-3 may be similarly folded as shown here. In the embodiment of FIG. 4, the sidewall 300b is shown and includes one of the folding guides 106b integrally formed on the right end of the sidewall. In the embodiment of FIG. 4, a first circuit board 102a is on the bottom of the figure and in this example includes a first rigid circuit board 400a and an outer layer 402a formed on the first rigid circuit board. The first rigid circuit board 400a is a conventional printed circuit board for physically attaching and electrically interconnecting electronic components (not shown) of the first circuit board 102a. Accordingly, the first rigid circuit board 400a includes one or more insulating layers and one or more conductive layers suitably patterned to provide for the required mounting and electrical interconnection of the electronic components. One skilled in the art will understand suitable structures for the first rigid circuit board 400a and thus this circuit board will not be described in detail herein. The outer layer 402a may comprise a conductive ground plane to provide electromagnetic shielding for the folded circuit board. The ground plane may be electrically coupled to a ground of the first rigid circuit board 400a, for example.

In the embodiment of FIG. 4, the second circuit board 102b is on the top of the figure and in this example includes a second rigid circuit board 400b and an outer layer 402b formed on the second rigid circuit board. The second rigid circuit board 400b is a conventional printed circuit board for physically attaching and electrically interconnecting electronic components (not shown) of the second circuit board 102b. The second rigid circuit board 400b accordingly includes one or more insulating layers and one or more conductive layers suitably patterned to provide for the required mounting and electrical interconnection of the electronic components. As with the first rigid circuit board 400a, one skilled in the art will understand suitable structures for the second rigid circuit board 400b and thus this circuit board will not be described in detail herein. The outer layer 402b may similarly comprise a conductive ground plane, which may be electrically coupled to the second rigid circuit board 400b. In this example, a mounted connector 454 to plug in external module (e.g. LTE or 4G module) is coupled to the second circuit board 102b will be described in more detail below with reference to FIG. 5.

In the example embodiment of FIG. 4, a flexible interconnect 404 is illustrated as being integrally formed as part of the outer layers 402a and 402b. In addition to physically coupling the first circuit board 402a to the second circuit board 402b, the flexible interconnect 404 also includes electrical interconnections (e.g., conductive traces or wires) between the first and second circuit boards 402a, 402b. More specifically, the first rigid circuit board 400a is electrically coupled through the first outer layer 402a and then through the flexible interconnect 404 to the second outer layer 402b and thereby to the second rigid circuit board 400b. The flexible interconnect 404 also includes an outer conductive ground plane to provide electromagnetic shielding for the folded circuit board. The conductive ground planes of the flexible interconnect 404, first outer layer 402a and second outer layer 402b may be the same layer coupled to receive a ground reference voltage for the folded circuit board. The sidewalls 300a, 300b, 302 and folding guides 106a, 106b may also be coupled to the ground plane.

As seen in FIG. 4, the sidewall 300b is physically attached or mounted to the first rigid circuit board 400a. The folded circuit board 400 further includes a number of connectors 406 that are physically attached or mounted to the second rigid circuit board 400b. Two of these connectors 406a and 406b are illustrated in FIG. 4. The connectors 406a, 406b are positioned on the second rigid circuit board 400b and are configured so that when the second circuit board 400b is folded over the first circuit board 400a each connector receives and attaches to a corresponding one of the sidewalls 300a, 300b or 302 (FIG. 3). For example, the connector 406a attaches to the sidewall 300b in the embodiment of FIG. 4. In this way, the connectors 406 secure or attach the second circuit board 400b over the first circuit board 400a in the position illustrated in FIG. 4 to form the folded circuit board 400. In addition, in the embodiment of FIG. 4 each of the connectors 406a, 406b detachably connects to the corresponding sidewall 300a, 300b or 302 to enable the folded circuit board 400 to be unfolded by detaching each of the connectors from the corresponding sidewall as a be described in more detail below.

Figure 5:
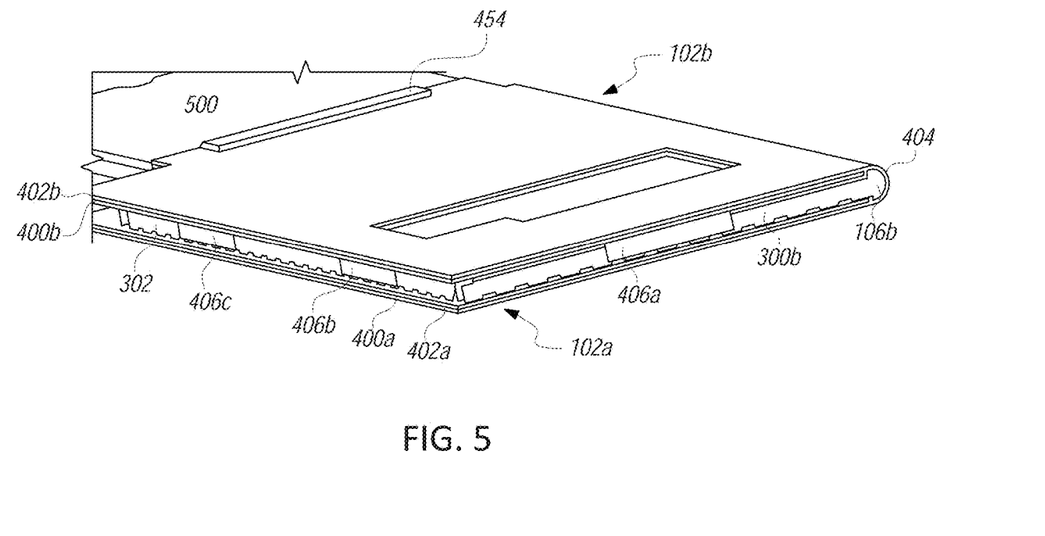
FIG. 5 is a perspective folded view of the folded circuit board of FIG. 4.
Figure 6:
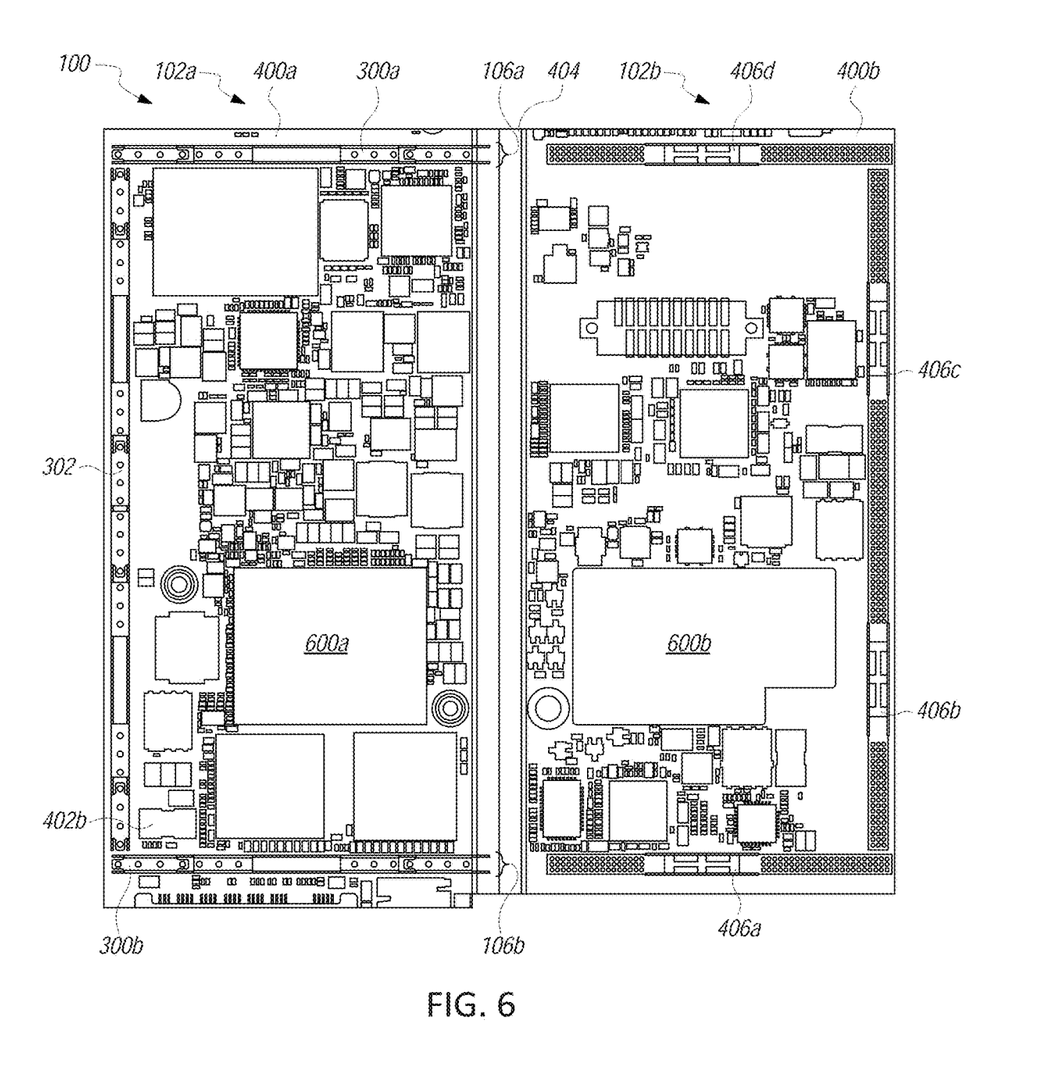
FIG. 6 is a more detailed unfolded top view of the folded printed circuit board of FIGS. 4 and 5.

FIG. 5 is a perspective folded view of the folded circuit board 400 of FIG. 4. In the perspective view of FIG. 5, the sidewall 302 is also seen along with an additional connector 406c that along with the connector 406b detachably connects to the sidewall. Also seen is the plug-in connector 404 that electrically couples to the second circuit board 102b to additional electronic circuitry 500 in this example embodiment. FIG. 6 is a more detailed unfolded top view of the folded printed circuit board 400 of FIGS. 4 and 5 and shows all the sidewalls 300a, 300b and 302 attached in a U-shaped shield configuration to the first rigid circuit board 400a of the first circuit board 102a. FIG. 6 also illustrates electronic components 600a and 600b mounted on the first and second rigid circuit boards 400a and 400b, respectively. Only one of the electronic components 600a, 600b on each of the first and second rigid circuit boards 400a, 400b is expressly labelled to simplify the figure.

As seen in FIG. 6, most of the electronic components 600a on the first rigid circuit board 400a are contained within the U-shaped shield configuration formed by the sidewalls 300a, 300b and 302. The same is true for the electronic components 600b on the second rigid circuit board 400b. Accordingly, when the second circuit board 102b is folded over the first circuit board 102a (FIGS. 4 and 5) the electronic components 600a and 600b are contained within the U-shaped shield configuration formed by the sidewalls 300a, 300b and 302. To attach the two circuit boards when they are folded together, connectors 406a-406d on circuit board 102b are configured in a mirrored U-shaped configuration as shown on the right in FIG. 6. This top view also shows an additional connector 406d positioned at the top of the second rigid circuit board 400b to detachably connect to the sidewall 300a at the top of the first rigid circuit board 400a. Each of the connectors 406a-406d may be positioned on the second rigid circuit board 400b to detachably connect to a corresponding one of the sidewalls 300a, 300b and 302 when the second circuit board 102b is folded over the first circuit board 102a during assembly of the folded circuit board 100. The connectors 406b and 406c both attached to the sidewall 302 in this example embodiment.

A process of manufacturing the folded circuit board will now be described in more detail with reference to FIGS. 4-6. The order in which the steps of this process are performed vary in different embodiments of the present disclosure and thus is not limited to the particular sequence or order that will now be described. The process includes attaching the electronic components 600a and 600b to the rigid circuit boards 400a and 400b of the first and second circuit boards 102a and 102b. The sidewalls 300a, 300b and 302 are attached to the rigid circuit board 400a of the first circuit board 102a and the connectors 406a-406d are attached to the rigid circuit board 400b of the second circuit board 102b. Further, the outer layers 402a, 402b and the flexible interconnect 404 are formed. Accordingly, the second circuit board 102b may be folded over the first circuit board 102a and each of the connectors 406a-406d attached to the corresponding one of the sidewalls 300a, 300b and 302 for complete assembly or manufacture of the folded circuit board 400.

Referring back to FIGS. 4 and 5, the curved surfaces of the folding guides 106a, 106b function to guide the bending or curve of the flexible interconnect 404 when the first circuit board 102a is folded over the second circuit board 102b during this assembly process. This structure results in a curved shape of the flexible interconnect 104 that follows the curved surfaces of the folding guides 106a, 106b. Without the folding guides 106a, 106b, the flexible interconnect may not have the desired curve when the second circuit board 102b is folded over the first circuit board 102a. In addition, as seen in FIG. 4 the structure of the folding guides 106a, 106b also allow these folding guides to function as electromagnetic shields along with the sidewalls 300a, 300b and 302. The outer conductive layer on the flexible interconnect 404 functions to shield electromagnetic radiation generated by the electrical components 600a, 600b (FIG. 6), but without the folding guides some of this electromagnetic radiation would propagate out (or "leak" out) of the apertures that would, in the absence of the folding guides 106a, 106b, be present between the bent flexible interconnect 404 and the edges of the first and second circuit boards 102a, 102b that the flexible interconnect spans. In some embodiments, the guides 106a, 106b and sidewalls 300a, 300b, 302 may be grounded to form an EMI shield around the edges of the circuit boards and conforming with the bent flexible interconnect 404 to reduce EMI from the folded circuit board assembly.

Figure 7:
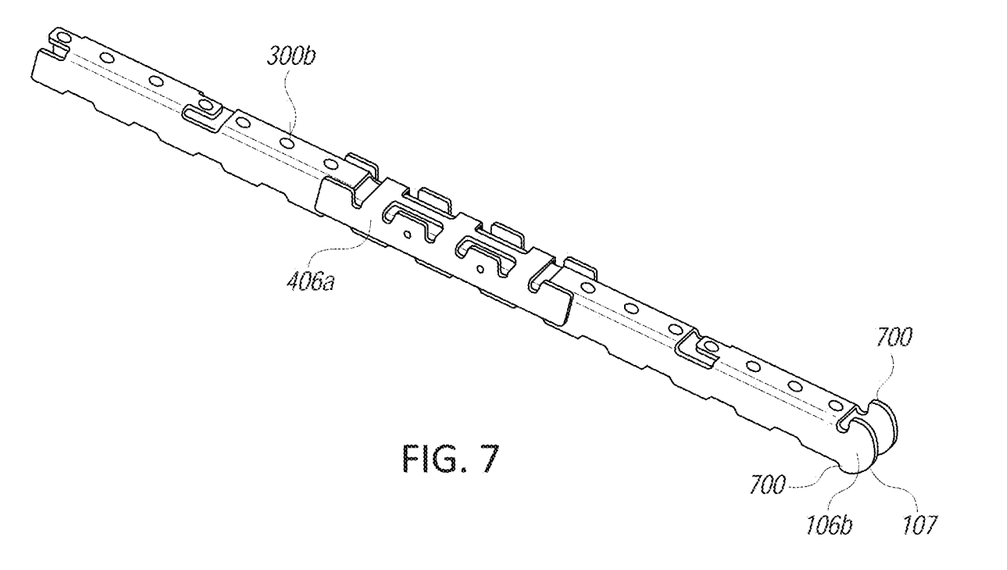
FIG. 7 is a perspective view showing a connector attached to a sidewall of FIGS. 4-6 according to an embodiment of the present disclosure.
Figure 8:
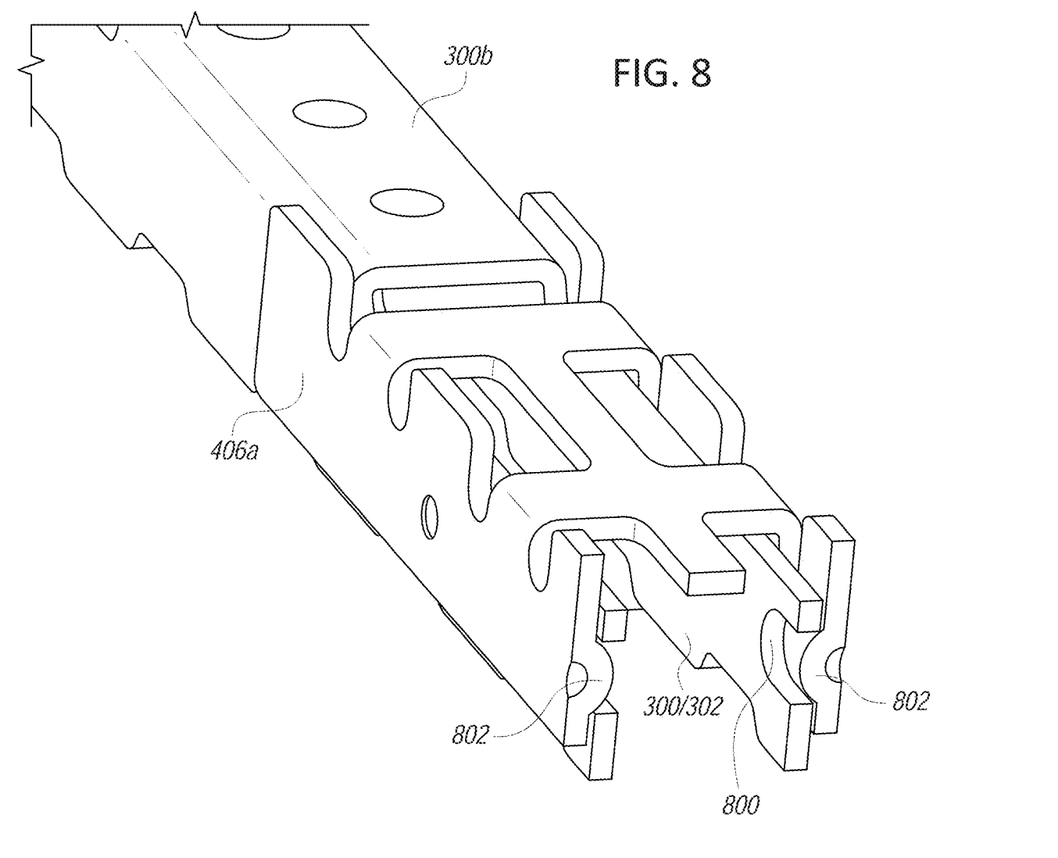
FIG. 8 is a perspective cross-sectional view of the connector and sidewall of FIG. 7.

FIG. 7 is a perspective view showing the connector 406a attached to the sidewall 300b of FIGS. 4-6 according to an embodiment of the present disclosure. The connector 406a is configured to receive or fit over the sidewall 300b when the second circuit board 102b is folded over the first circuit board 102a as described above. Sufficient pressure is then supplied downward on the connector 406a to cause the connector to detachably connect to the sidewall 300b. FIG. 8 is a perspective cross-sectional view of the connector 406a and sidewall 300b of FIG. 7 showing in more detail one example detachable connection of these two components. More specifically, in the embodiment of FIG. 8 the sidewall 300b includes apertures 800 that are adapted to receive coupling protrusions 802 on the connector 406a to thereby attach the connector to the sidewall. In operation, a downward force is applied to the connector 406a to push the connector downward over the sidewall 300b until each coupling protrusion 802 is positioned in a corresponding aperture 802 in the sidewall 300b. Each coupling protrusion 802 has a curved surface as seen in FIG. 8, which allows the connector 406a to more easily be attached and detached from the sidewall 300b through application of a sufficient downward or upward force, respectively. Recall, the connector 406a is attached to the second circuit board 102b. Thus, to detach the connector 406a from the sidewall 300b a sufficient force would be applied to the second circuit board 102b to cause the connector 406a to move upward. This upward force on the connector 406a causes the sides of the sidewall 300b to provide outward forces that flex the sides of the connector 406a in response to this upward force. These outward forces on the sides of the connector 406a thereby push the coupling protrusions outward and the apertures 800 enable the connector 406a to be removed for the sidewall 300b.

The structure and operation of the connector 406b and sidewall 300a is the same as that illustrated in FIGS. 7 and 8 for connector 406a and sidewall 300b. Similarly, the structure of the connectors 406c, 406d and the sidewall 302 may be the same as that shown in FIGS. 7 and 8, although the sidewall 302 will not include a folding guide 106a, 106b at one end since the sidewall 302 extends between sidewalls 300a and 300b as shown in FIG. 6 and performs no guiding function of the flexible interconnect 104 during the assembly of the folded circuit board 100. The structures of the connectors 406 and sidewalls 300, 302 along with the specific mechanism through which the connector detachably couples to the sidewall may vary in other embodiments of the present disclosure. For example, while the protrusions are illustrated above as being part of the connectors and the apertures part of the sidewalls, it is to be understood that the protrusions may be part of the sidewalls and the apertures part of the connectors in other embodiments. Additionally, other attachment mechanisms may be used for securing first and second circuit boards in a folded circuit board with improved EMI shielding in other embodiments. The above arrangement is but one example.

Referring back to FIG. 7, the folding guide 106b is seen to include inner edges 700 that provide recesses for the rigid circuit boards 400a, 400b. The recesses ensure that the rigid circuit boards 400a, 400b are recessed relative to curve surface 107 of the folding guide 106b so that when the boards 102a, 102b are folded as shown in FIG. 4 the flexible interconnect 104 and outer layers 402a, 402b form a smooth curve around the curve surface 107 so that the first and second circuit boards 102a, 102b are positioned parallel to one and at a desired vertical distance from one another as seen in FIG. 4. In FIG. 4 the rigid circuit boards 400a, 400b are parallel to one another in a plane extending from left to right in the figure and into the page. In this position the circuit boards 400a, 400b are also spaced a desired vertical distance from one another, where this vertical distance is orthogonal to the plane extending from left to right in the figure and into the page.

Figure 9:
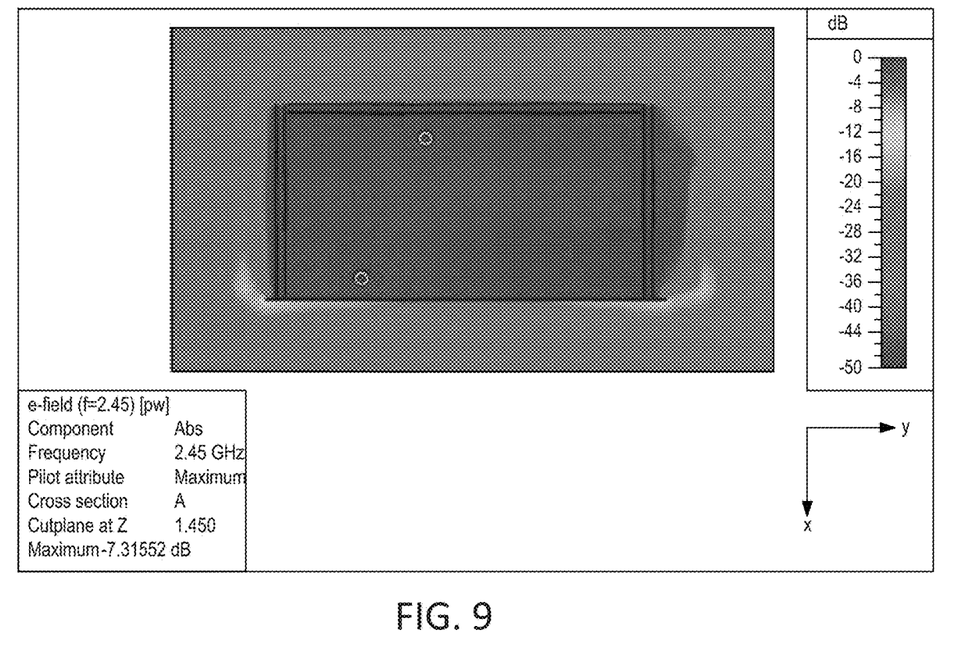
FIG. 9 is an electromagnetic radiation diagram illustrating the shielding effectiveness of the sidewalls and connectors structure of FIGS. 4-6 in the 2.4 GHz frequency band.
Figure 10:
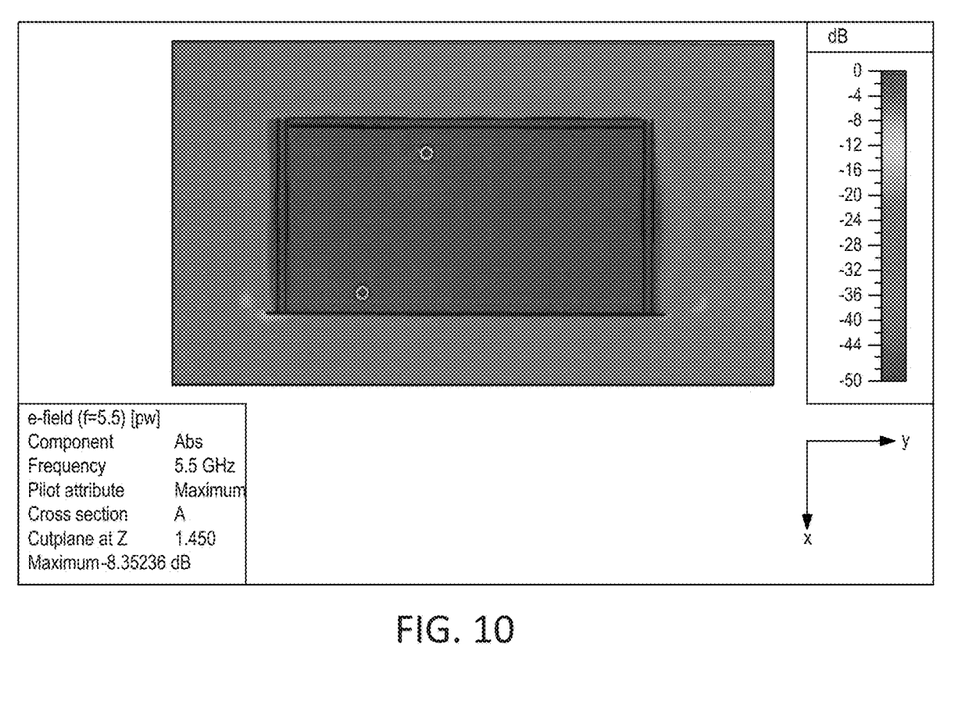
FIG. 10 is an electromagnetic radiation diagram illustrating the shielding effectiveness of the sidewalls and connectors structure of FIGS. 4-6 in the 5 GHz frequency band.
Figure 11:
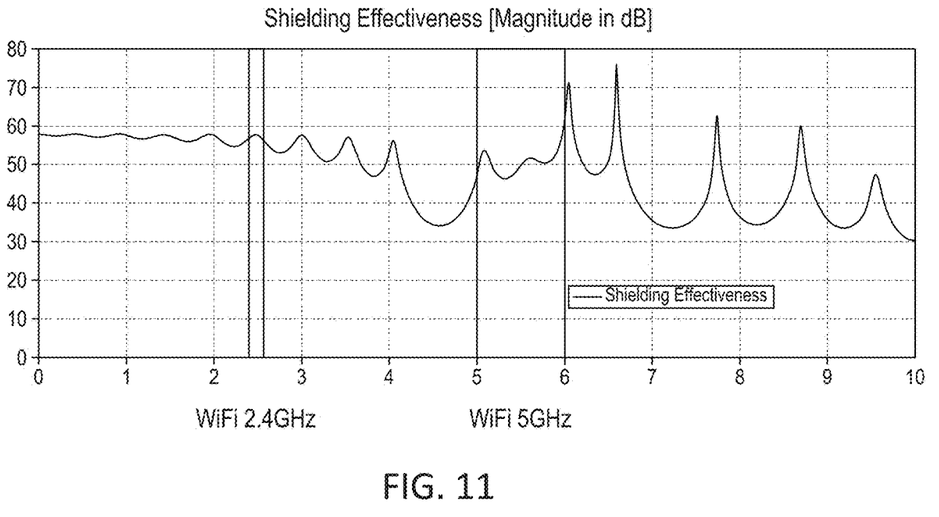
FIG. 11 is graph illustrating the shielding effectiveness of the sidewalls and connectors structure of FIGS. 4-6 from 0 to 10 GHz.

FIG. 9 is an electromagnetic radiation diagram illustrating the shielding effectiveness of the shielding and attachment structure including the sidewalls 300a, 300b, 302, folding guides 106a, 106b, connectors 406a-406d, and the ground plane formed by the outer layer of the flexible interconnect 104 and outer layers 402a, 402b. FIG. 9 illustrates this shielding and attachment structure provides at least 45 dB of shielding on the inner side of this structure at the 2.4 GHz Wi-Fi frequency. FIG. 10 is an electromagnetic radiation diagram that similarly illustrates the shielding and attachment structure provides at least 45 dB of shielding on the inner side of this structure at the 5 GHz Wi-Fi frequency. FIG. 11 is a graph illustrating the shielding effectiveness of the shielding and attachment structure over the frequency range of 0 to 10 GHz. The vertical axis is decibels dB and the horizontal axis frequency in Gigahertz GHz. The graph shows at least 45 dB of attenuation or shielding effectiveness in the 2.4 GHz and 5 GHz frequency bands, which are shown highlighted in gray in the graph.

Figure 12:
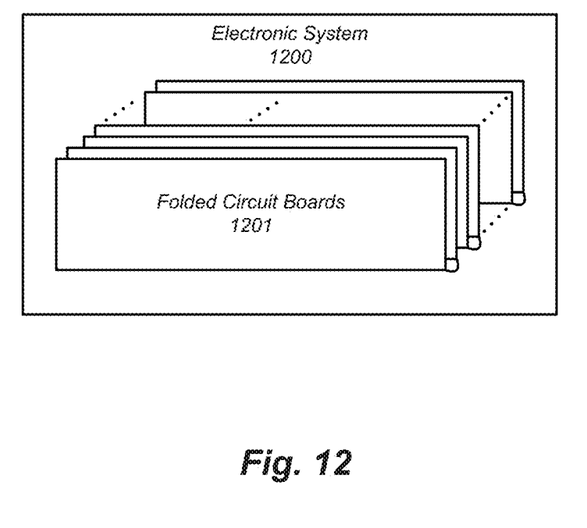
FIG. 12 is an electronic system including at least one folded printed circuit board of according to further embodiment of the present disclosure.

FIG. 12 is an electronic system 1200 including one or more folded circuit boards according to further embodiments of the present disclosure. Folded circuit boards according to various embodiments may be used for a wide range of purposes. For example, one folded circuit board 1201 may comprise wireless functionality. Other folded circuit boards 1201 may comprise networking functionality. Yet other folded circuit boards 1201 may comprise data processing or data storage functionality, for example. Multiple folded circuit boards may be coupled together (e.g., over one or more buses or data interconnects). Folded circuit boards may be coupled to one or more other folded circuit boards having the same functionality or having different functionalities, for example. In various embodiments, electronic system 1200 comprising one or more folded circuit boards 1201 may be a server, data storage system, networking system, wireless system, or a portable electronic device such as a cellular mobile phone, tablet computer, or other electronic systems that would benefit from incorporating more electronics into a smaller space with reduced EMI, for example.

FURTHER EXAMPLE EMBODIMENTS

In one embodiment, a folded circuit board includes a means for shielding electromagnetic radiation along an edge of a flexible interconnect generated by the first circuit board and the second circuit board when the first circuit board is folded over the second circuit board. The means for shielding electromagnetic radiation along edge of the flexible interconnect corresponds to grounded folding guides 106a, 106b shown in FIG. 1. In one embodiment, the folded circuit board further includes means for attaching the first circuit board to the second circuit board. This means for attaching includes the sidewalls 300a, 300b, 302 and connectors 406a-406d in the embodiments of FIGS. 1-6.

In further example embodiments, a folded circuit board includes a first circuit board and a second circuit board. The first circuit board and the second circuit board are coupled together through a flexible interconnect. One or more folding guides are coupled to one of the first circuit board or second circuit board. The one or more folding guides extend beyond a first edge of the one of the first circuit board or second circuit board. The one or more folding guides include a curved sidewall configured to guide the flexible interconnect when the first circuit board is folded over the second circuit board. In one embodiment, the one or more folding guides are coupled to a plurality of sidewalls configured around a plurality of edges of the first circuit board and second circuit board to reduce electromagnetic leakage of the folding circuit board.

In another embodiment, each of the first circuit board and second circuit board include a plurality of electrical components, and the one or more folding guides include at least two conductive folding guides coupled to the one of the first circuit board or second circuit board to provide electromagnetic shielding. The at least two conductive folding guides include first and second conductive folding guides positioned proximate to second and third edges, respectively, of the one of the first circuit board or second circuit board. The flexible interconnect may have a length that is approximately equal to a curved length of the curved sidewall in embodiments of the present disclosure. In an embodiment, the first circuit board includes a first surface and the second circuit board includes a second surface and the one or more folding guides are configured to define an orthogonal distance between the first surface and the second surface when the first circuit board is folded over the second circuit board.

In another embodiment, the one or more folding guides include a first folding guide and a second folding guide. The first folding guide includes a first sidewall extending from the first edge of the one of the first circuit board or second circuit board towards a second edge of the one of the first circuit board or second circuit board. The second edge is opposite the first edge, and the second folding guide includes a second sidewall extending from the first edge of the one of the first circuit board or second circuit board towards the second edge. The first sidewall and second sidewall provide electromagnetic shielding in this embodiment. In an embodiment, a third sidewall is coupled to the one of the one of the first circuit board or second circuit board proximate the second edge and between the first sidewall and the second sidewall. This third sidewall provides electromagnetic shielding.

In further embodiments, a plurality of connectors are coupled to the other one of the first circuit board and second circuit board. Each of the plurality of connectors is configured to couple to one of the first sidewall, second sidewall, and third sidewall when the first circuit board is folded over the second circuit board. In an embodiment, each of the first folding guide, second folding guide, first sidewall, second sidewall, third sidewall, and plurality of connectors includes a conductive material. The curved sidewall is an arced sidewall some embodiments. In an embodiment, each of the one or more folding guides has an inner edge extending parallel to the edge of the one of the first circuit board or second board. The inner edge has a length equal or greater than a thickness of the one of the first circuit board or second circuit. The one or more folding guides are coupled to ground in some embodiments.

In another embodiment, a folded circuit board comprises a first circuit board, a second circuit board, a flexible interconnect coupled between the first circuit board and the second circuit board, and means for shielding electromagnetic radiation along an edge of the flexible interconnect generated by the first circuit board and the second circuit board when the first circuit board is folded over the second circuit board.

In one embodiment, the present disclosure further comprises a means for attaching the first circuit board to the second circuit board.

In one embodiment, the means for shielding comprises a first grounded guide, and a second grounded guide, wherein the first grounded guide and second grounded guide include a curved surface to conform with the flexible interconnect when the first circuit board is folded over the second circuit board.

In still further embodiments, an electronic system includes electronic circuitry configured to receive at least one folded circuit board. The at least one folded circuit board includes a first circuit board and a second circuit board. The first circuit board and the second circuit board are coupled together through a flexible interconnect. One or more folding guides is coupled to one of the first circuit board or second circuit board. The one or more folding guides extend beyond a first edge of said one of the first circuit board or second circuit board. The one or more folding guides include a curved sidewall configured to guide the flexible interconnect when the first circuit board is folded over the second circuit board. In an embodiment, the one or more folding guides are coupled to a plurality of sidewalls configured around a plurality of edges of the first circuit board and second circuit board to reduce the radiation of electromagnetic energy from the folding circuit board. In embodiments, the electronic circuitry includes one of server, cellular base station, and router circuitry.

In further embodiments, a method of manufacturing a folded circuit board includes attaching a first circuit board to a second circuit board through a flexible interconnect and attaching one or more folding guides to the second circuit board. The one or more folding guides extend beyond a first edge of the second circuit board and include a curved sidewall configured to guide the flexible interconnect when the first circuit board is folded over the second circuit board. The method includes folding the first circuit board over the second circuit board and attaching the first circuit board to the second circuit board to form the folded printed circuit board. In an embodiment, the folding guides comprise one or more sidewalls extending along a second edge of the second circuit board. In a further embodiment, the method includes positioning one or more connectors at locations on the first circuit board to receive the one or more sidewalls when the first circuit is folded over the second circuit board. These one or more connectors are attached to the first circuit board at the locations. In an embodiment, attaching one or more sidewalls to the second circuit board includes attaching first and second sidewalls to the second circuit board extending from the first edge to a second edge opposite the first edge. A third sidewall is attached to the second circuit board extending between the first and second sidewalls parallel to the first edge. In an embodiment, attaching the first circuit board to the second circuit board to form the folded circuit board includes attaching one or more sidewalls to the second circuit board and attaching one or more connectors to the first circuit board. Each of the one or more connectors is positioned to couple to a respective one of the one or more sidewalls. In an embodiment, attaching one or more folding guides to the second circuit board includes coupling the one or more folding guides to a ground reference plane.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:
1. A folded circuit board, comprising:
a first circuit board;
a second circuit board, wherein the first circuit board and the second circuit board are coupled together through a flexible interconnect that flexes when the first circuit board folds over the second circuit board;

one or more folding guides coupled to one of the first circuit board or second circuit board, the one or more folding guides extending beyond a first edge of the one of the first circuit board or second circuit board, the one or more folding guides comprising a curved sidewall configured to engage the flexible interconnect to guide the flexing of the flexible interconnect as the first circuit board folds over the second circuit board.

2. The folded circuit board of claim 1, wherein each of the first circuit board and second circuit board include a plurality of electrical components, and wherein the one or more folding guides are coupled to a plurality of sidewalls configured around a plurality of edges of the first circuit board and second circuit board to enclose the electrical components of the first and second circuit boards to reduce electromagnetic leakage of the folded circuit board.

3. The folded circuit board of claim 1, wherein each of the first circuit board and second circuit board include a plurality of electrical components, and wherein the one or more folding guides comprise at least two conductive folding guides coupled to the one of the first circuit board or second circuit board to contribute to enclosing the electrical components of the first and second circuit boards to provide for electromagnetic shielding for the folded circuit board.

4. The folded circuit board of claim 3, wherein the at least two conductive folding guides comprise first and second conductive folding guides positioned proximate to second and third edges, respectively, of the one of the first circuit board or second circuit board.

5. The folded circuit board of claim 1, wherein the flexible interconnect has a length that is approximately equal to a curved length of the curved sidewall.

6. The folded circuit board of claim 1, wherein the first circuit board includes a first surface and the second circuit board includes a second surface and wherein the one or more folding guides is configured to define an orthogonal distance between the first surface and the second surface when the first circuit board is folded over the second circuit board.

7. The folded circuit board of claim 1, wherein the one or more folding guides comprise a first folding guide and a second folding guide, the first folding guide including a first sidewall extending from the first edge of the one of the first circuit board or second circuit board towards a second edge of the one of the first circuit board or second circuit board, the second edge being opposite the first edge, and wherein the second folding guide comprises a second sidewall extending from the first edge of the one of the first circuit board or second circuit board towards the second edge, wherein the first sidewall and second sidewall contribute to provide electromagnetic shielding for the folded circuit board.

8. The folded circuit board of claim 7, further comprising a third sidewall coupled to the one of the one of the first circuit board or second circuit board proximate the second edge and between the first sidewall and the second sidewall, wherein the third sidewall cooperates with the first and second sidewalls to further contribute to provides electromagnetic shielding for the folded circuit board.

9. The folded circuit board of claim 8 further comprising a plurality of connectors coupled to the other one of the first circuit board and second circuit board, each of the plurality of connectors configured to couple to one of the first sidewall, second sidewall, and third sidewall when the first circuit board is folded over the second circuit board.

10. The folded circuit board of claim 9, where each of the first folding guide, second folding guide, first sidewall, second sidewall, third sidewall, and plurality of connectors comprise a conductive material.

11. The folded circuit board of claim 1, wherein the curved sidewall comprises an arced sidewall.

12. The folded circuit board of claim 1, wherein each of the one or more folding guides has an inner edge configured to provide a recess for the first circuit board and second circuit board to position the first circuit board at a desired vertical distance from the second circuit board.

13. The folded circuit board of claim 1, wherein the one or more folding guides are coupled to ground.

14. A folded circuit board, comprising:
a first circuit board;
a second circuit board;
a flexible interconnect coupled between the first circuit board and the second circuit board that flexes when the first circuit board folds over the second circuit board; and
means for shielding electromagnetic radiation along an edge of the flexible interconnect generated by the first circuit board and the second circuit board when the first circuit board is folded over the second circuit board;
wherein the means for shielding comprises:
a first grounded guide; and
a second grounded guide,
wherein the first grounded guide and second grounded guide include a curved surface to engage with the flexible interconnect to guide the flexing of the flexible interconnect when the first circuit board folds over the second circuit board.

15. The folded circuit board of claim 14, further comprising a means for attaching the first circuit board to the second circuit board.

16. An electronic system, comprising:
electronic circuitry configured to receive at least one folded circuit board, the at least one folded circuit board including:
a first circuit board;
a second circuit board, wherein the first circuit board and the second circuit board are coupled together through a flexible interconnect that flexes as the first circuit board folds over the second circuit board;
one or more folding guides coupled to one of the first circuit board or second circuit board, the one or more folding guides extending beyond a first edge of said one of the first circuit board or second circuit board, the one or more folding guides comprising an curved sidewall configured to engage the flexible interconnect to guide the flexing of the flexible interconnect when the first circuit board folds over the second circuit board.

17. The electronic system of claim 16, wherein the one or more folding guides are coupled to a plurality of sidewalls configured around a plurality of edges of the first circuit board and second circuit board to contribute to enclosing circuit elements of the first and second circuit boards that radiate electromagnetic energy to reduce radiation of the electromagnetic energy out of the folding circuit board.

18. The electronic system of claim 16, wherein the electronic circuitry comprises one of server, a networking system, a data storage system, a wireless system, or a portable electronic device.

19. A method of manufacturing a folded circuit board, comprising:
attaching a first circuit board to a second circuit board through a flexible interconnect that flexes when the first circuit board folds over the second circuit board;

attaching one or more folding guides to the second circuit board, the one or more folding guides extending beyond a first edge of the second circuit board and including a curved sidewall configured to engage the flexible interconnect to guide the flexing of the flexible interconnect when the first circuit board folds over the second circuit board; and folding the first circuit board over the second circuit board with flexing of the flexible interconnect guided by the one or more engaged folding guides to form a folded printed circuit board.

20. The method of claim 19, wherein the folding guides comprise one or more sidewalls extending along a second edge of the second circuit board, the one or more sidewalls contribute to enclosing circuit elements of the first and second circuit board when the first circuit board is folded over the second circuit board, to reduce leakage of electromagnetic energy generated by the circuit elements to outside of the folded printed circuit board.

21. The method of claim 20, further comprising:
positioning one or more connectors on the first circuit board, each of the one or more connectors positioned to receive a respective one of the one or more sidewalls when the first circuit is folded over the second circuit board; and attaching the one or more connectors to the first circuit board at locations.

22. The method of claim 21, further comprising attaching a third sidewall to the second circuit board extending between first and second sidewalls parallel to the first edge.

23. The method of claim 19, wherein attaching the first circuit board to the second circuit board to form the folded circuit board comprises attaching one or more sidewalls to the second circuit board and attaching one or more connectors to the first circuit board, each of the one or more connectors positioned to couple to a respective one of the one or more sidewalls.

24. The method of claim 19, wherein attaching one or more folding guides to the second circuit board comprises coupling the one or more folding guides to a ground reference plane.

* * * * *

UNITED STATES PATENT AND TRADEMARK OFFICE
CERTIFICATE OF CORRECTION

| | | |
|---|---|---|
| PATENT NO. | : 10,939,540 B2 | Page 1 of 1 |
| APPLICATION NO. | : 16/399825 | |
| DATED | : March 2, 2021 | |
| INVENTOR(S) | : Tin Poay Chuah et al. | |

It is certified that error appears in the above-identified patent and that said Letters Patent is hereby corrected as shown below:

In the Claims

Column 12
Line 48, "…an curved…" should read "…a curved…"

Signed and Sealed this
Eleventh Day of May, 2021

Drew Hirshfeld
*Performing the Functions and Duties of the
Under Secretary of Commerce for Intellectual Property and
Director of the United States Patent and Trademark Office*